United States Patent [19]
Smith

[11] Patent Number: 5,963,157
[45] Date of Patent: Oct. 5, 1999

[54] METHOD AND APPARATUS FOR THE ADDITION AND REMOVAL OF A DITHER SIGNAL

[75] Inventor: Paul F. Smith, North Richland Hills, Tex.

[73] Assignee: Motorola, Inc., Schaumburg, Ill.

[21] Appl. No.: 08/880,480

[22] Filed: Jun. 23, 1997

[51] Int. Cl.⁶ .................................................. H03M 1/00
[52] U.S. Cl. ........................................................ 341/131
[58] Field of Search ................................... 341/131, 144; 364/602; 327/105

[56] References Cited

U.S. PATENT DOCUMENTS 5,291,428  3/1994  Twitchell et al. ...................... 364/602

*Primary Examiner*—Brian Young
*Attorney, Agent, or Firm*—Kenneth A. Haas; Mario J. Donato, Jr.

[57] ABSTRACT

The addition and removal of a dither signal takes place by generation of a first signal (102) and a second signal (104) by a first signal source (151) and a second signal source (152). A dither generator (103) is provided that generates a dither signal (106) that is added to the first signal (102) and subtracted from the second signal (104). The first signal (102) with dither added, and the second signal (104) with dither subtracted enter respective Digital to Analog Converters (DACs) (109, 111) and are converted to analog signal equivalents. Finally, the respective analog signal equivalents are summed together to form a composite signal with the dither signal (106) substantially eliminated.

16 Claims, 3 Drawing Sheets

METHOD AND APPARATUS FOR THE ADDITION AND REMOVAL OF A DITHER SIGNAL

Field of the Invention

The present invention relates generally to conversion of signals from digital to analog or vice versa and, in particular, to the addition and removal of a dither signal from the converted signals.

BACKGROUND OF THE INVENTION

When converting signals from a digital to an analog format dither is often added to reduce the effect of non-linearity in the Digital-to-Analog converter (DAC). In particular, as digital codes are input to the DAC, the analog output voltage may be skewed to an incorrect value. If a digital signal periodically uses a code which produces a skewed output voltage, then the output signal will be distorted. With dither added to the digital signal, each time the code would normally be used that produced a skewed output voltage, the dither perturbs the signal so that other digital codes are used instead. When this happens over many periods, an averaging effect takes place, resulting in a more correct output voltage. For small amounts of non-linearity, a small dither signal is sufficient. However, for effective dithering in segmented DACS, the dither noise signal must be large enough to average out the effects of crossing the segment boundaries.

Likewise, when converting signals from an analog to a digital format distortion results when the digital output codes correspond to incorrect analog input voltages. This distortion can be reduced by injecting an analog dither signal onto the analog signal prior to conversion to a digital format. In a manner similar to DACs described in the previous paragraph, analog dither must be of a magnitude to average out the effects crossing segment boundaries in a segmented analog-to-digital converter (ADC).

In both cases of digital-to-analog and analog-to-digital conversion of a signal, the dither signal may need to be eliminated from the converted signal in order to maintain signal quality. Therefore a need exists for a method and apparatus for the addition and removal of a dither signal from the converted signal.

DETAILED DESCRIPTION OF THE DRAWINGS

Figure 1:
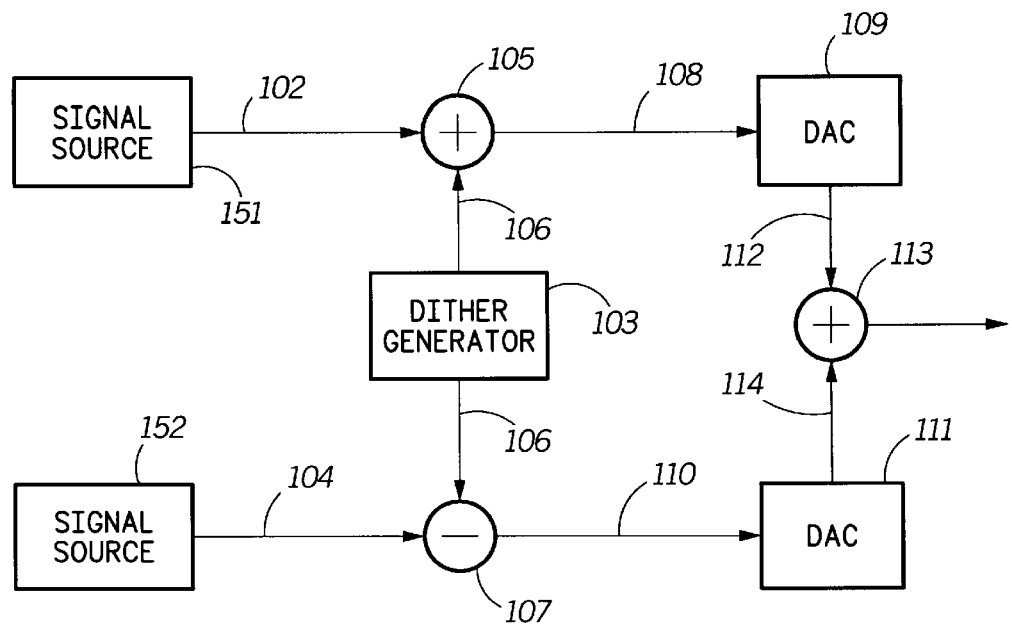
FIG. 1 is an apparatus for the addition and removal of a dither signal in accordance with the preferred embodiment of the present invention.

Stated generally, the addition and removal of a dither signal takes place by generation of a first signal and a second signal by a first signal source and a second signal source. A dither generator is provided that generates a dither signal that is added to the first signal and subtracted from the second signal. The first signal with dither added, and the second signal with dither subtracted enter respective Digital to Analog Converters (DACs) and are converted to analog signal equivalents. Finally, the respective analog signal equivalents are summed together to form a composite signal with the dither signal substantially eliminated.

The present invention encompasses a method for adding and removing dither from a first and a second digital signal. The method comprises the steps of combining dither at a first phase with the first digital signal to produce a first digital signal with dither and combining dither at a second phase with the second digital signal to produce a second digital signal with dither. In the preferred embodiment of the present invention the second phase is substantially 180 degrees offset from the first phase. The method additionally comprises the steps of converting the first digital signal with dither to a first analog signal with dither and converting the second digital signal with dither to a second analog signal with dither. Finally the first and the second analog signals are combined to produce a third analog signal having the dither substantially removed.

A second embodiment of the present invention encompasses a method for adding and removing a dither signal from a plurality of signals where a sum of the plurality of signals equals a first value. The method comprises the steps of combining a plurality of dither signals at a plurality of phases with the plurality of signals to produce a plurality of signals with dither. In the preferred embodiment a sum of the plurality of signals with dither is substantially equal to the first value. Continuing, the plurality of signals with dither are converted to a second plurality of signals with dither and then combined to form a combined signal having the plurality of dither signals substantially eliminated.

A final embodiment of the present invention encompasses an apparatus for adding and removing a dither signal from a plurality of signals, where a sum of the plurality of signals equals a first value. The apparatus comprises a plurality of signal sources generating a plurality of signals, a dither generator outputting a plurality of dither signals, first combining circuitry having the plurality of signals and the plurality of dither signals as an input and outputting a plurality of signals with dither, (where a sum of the plurality of signals with dither is substantially equal to the first value), a plurality of converters having the plurality of signals with dither as inputs and outputting a plurality of converted signals with dither, and a second combining circuit having the plurality of converted signals with dither as an input and outputting a combined signal having the plurality of dither signals substantially eliminated.

FIG. 1 is an apparatus 100 for the addition and removal of a dither signal in accordance with the preferred embodiment of the present invention. Apparatus 100 comprises a signal sources 151 and 152, dither generator 103, summing circuitry 105, summing circuitry 107, DAC 109,. DAC 111, and summing circuitry 113. In the preferred embodiment of the present invention signal sources 100 are signal sources such as Multi-Channel Digital Transceivers. In particular, signal sources 151 and 152 preferably output digital signals as described in U.S. Pat. No. 5,579,341 MULTI CHANNEL DIGITAL TRANSCEIVERS AND METHOD by Smith et al., that generate a series of 12bit digital words representing an equivalent analog signal. Additionally, dither generator 103 is preferably a Motorola Digital Signal Processor model #DSP56156 that generates a 10 bit (or more) dither signal. Although apparatus 100 is shown comprising multiple signals emanating from multiple signal sources, apparatus 100 may comprise multiple signals emanating from a single signal source without varying from the scope of the invention. In the preferred embodiment of the present invention the dither signal is uncorrelated to the input signal by choosing a random bit pattern for the dither signal. However, since the dither must be large in order to average out the effects of DAC segmentation, the random bit pattern must be chosen so that its frequency content does not interfere with the signal. This is accomplished by passing the random bits through a digital filter (not shown).

Operation of apparatus 100 in accordance with the preferred embodiment of the present invention occurs as follows: Digital signal sources 151 and 152 generate digital signals 102 and 104 that are output to both summing circuitry 105 and summing circuitry 107 respectively. As mentioned above, digital signals 102 and 104 comprise a series of 12 bit digital words output from multiple transceivers that represent analog signal equivalents. Additionally, dither generator 103 generates dither signal 106 that is output to both summing circuitry 105 and summing circuitry 107. In the preferred embodiment of the present invention, summing circuitry 105 adds dither signal 106 to digital signal 102, while summing circuitry 107 subtracts dither signal 106 from digital signal 104. In particular, summing circuitry 105 adds dither signal 106 to the 12 bit digital word 102 (signal 102) to produce signal 108. Additionally, summing circuitry 107 subtracts dither signal 106 from the digital word 104 (signal 104) to produce signal 110. Signals 108 and 110 enter respective DACs 109, 111 and are subsequently converted to an analog signal equivalent. In the preferred embodiment of the present invention DAC 109 and DAC 111 are identical DACs utilizing similar circuitry in order reduce board space and to keep each response similar.

Continuing, analog signals 112 and 114 output from DACs 109 and 111 respectively enter summing circuitry 113 where signals 112 and 114 are summed to produce an analog output signal with dither signal 106 substantially removed. In other words, because DACs 109 and 111 utilize similar circuitry (i.e., produce similar responses to digital input signals), the addition of signal 112 and signal 114 will result in the addition of two analog signals each having a dither component that is substantially 180 degrees offset from each other, resulting in a signal with the dither component substantially eliminated.

Figure 2:
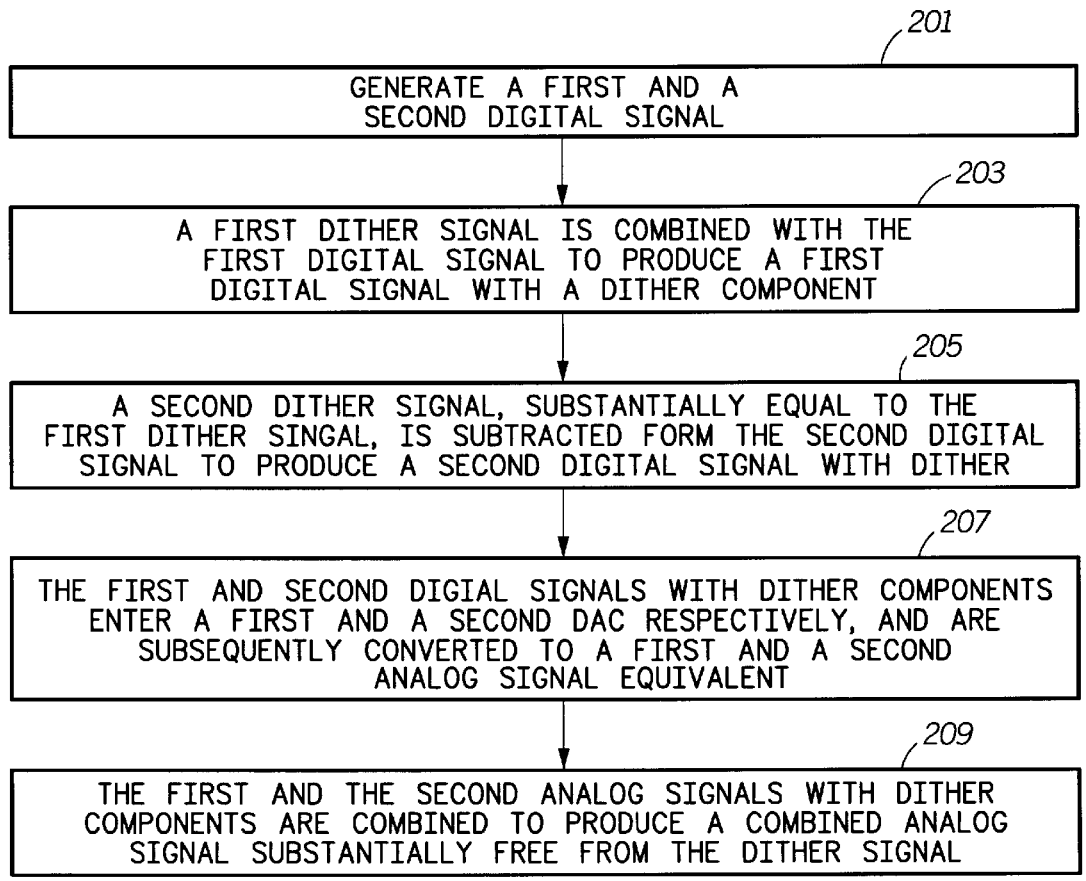
FIG. 2 illustrates a flow chart illustrating a method of operating the apparatus of FIG. 1 in accordance with the preferred embodiment of the present invention.

FIG. 2 illustrates a flow chart illustrating a method of operating the apparatus of FIG. 1 in accordance with the preferred embodiment of the present invention. The logic flow starts at step 201 where a first and a second digital signal is generated. In particular, this is accomplished by digital signal sources 151 and 152 generating digital signals 102 and 104 that are output to both summing circuitry 105 and summing circuitry 107 respectively. Next, at step 203 a first dither signal is combined with the first digital signal to produce a first digital signal with a dither component. In particular, dither generator 103 generates dither signal 106 that is output to summing circuitry 105 where it is added to digital signal 102. At step 205 a second dither signal, substantially equal to the first dither signal, is subtracted from the second digital signal to produce a second digital signal with dither. Although in the preferred embodiment, the second dither signal is subtracted from the second digital signal, in an alternate embodiment, the second dither signal is added to the second digital signal, however in this case, both dither signals are cyclical in nature and have phases substantially 180 degrees offset from each other. In both embodiments of the present invention addition/subtraction is accomplished by summing circuitry 107 subtracting dither signal 106 from digital signal 104. Continuing, the first and the second digital signals with dither components enter a first and a second DAC respectively, and are subsequently converted to a first and a second analog signal equivalent (step 207). This is accomplished in the preferred embodiment of the present invention by inputting signals 108 and 110 into respective DACs 109, 111. As mentioned above, in the preferred embodiment of the present invention DAC 109 and DAC 111 are identical DACs utilizing similar circuitry in order reduce board space and to keep each response similar.

Finally, at step 209, the first and the second analog signals with dither components are combined to produce a combined analog signal substantially free of the dither signal. In particular, analog signals 112 and 114 output from DACs 109 and 111 respectively enter summing circuitry 113 where signals 112 and 114 are summed to produce an analog output signal with dither signal 106 substantially removed. Because DACs 109 and 111 utilize similar circuitry (i.e., produce similar responses to digital input signals), the addition of signal 112 and signal 114 will result in the addition of two analog signals each having a dither component that is substantially 180 degrees offset from each other, resulting in a signal with the dither component substantially eliminated.

Figure 3:
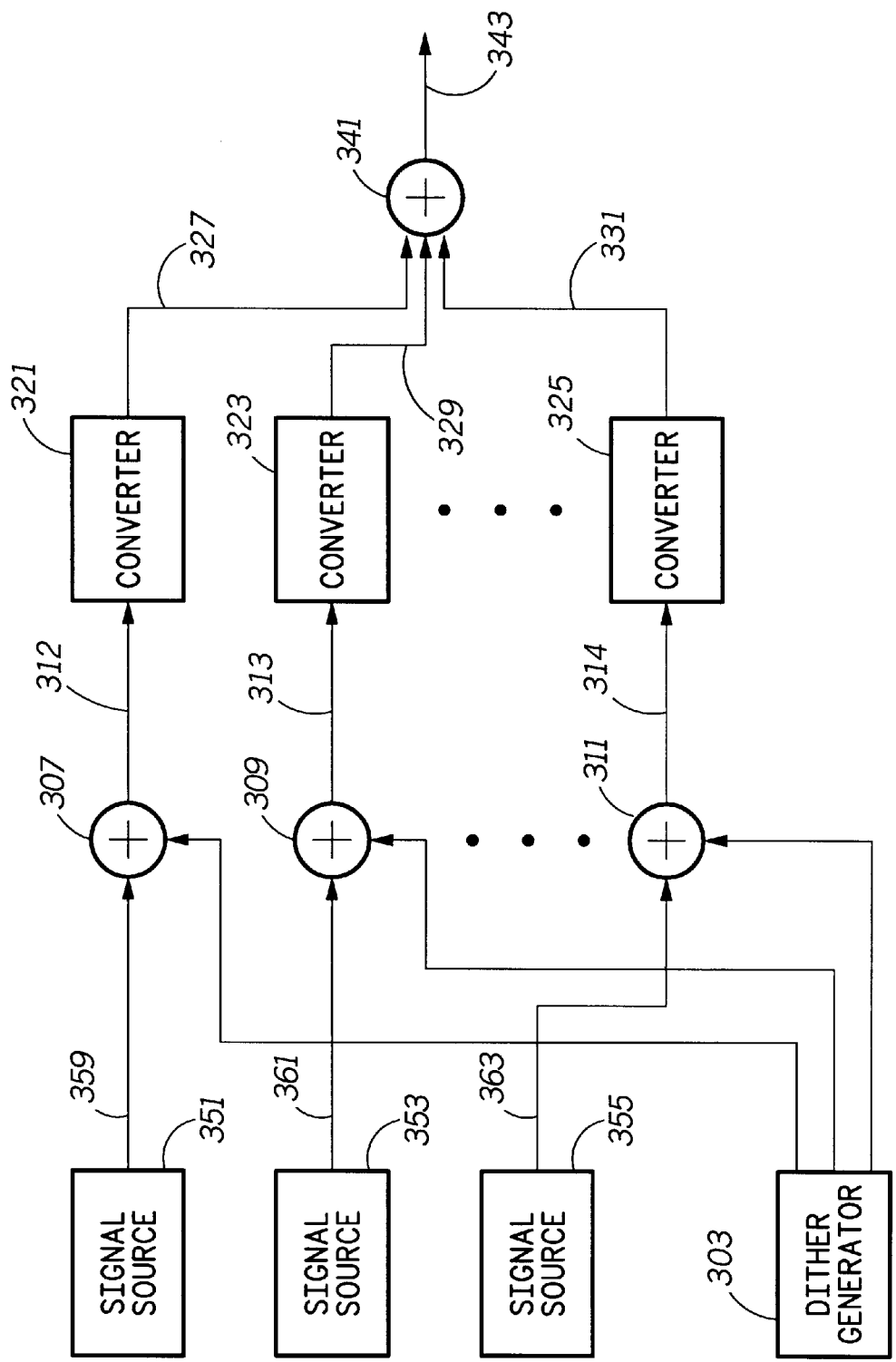
FIG. 3 is an apparatus for the addition and removal of a dither signal in accordance with an alternate embodiment of the present invention.

FIG. 3 is an apparatus 300 for the addition and removal of a dither signal in accordance with an alternate embodiment of the present invention. Unlike the preferred embodiment of the present invention, the alternate embodiment of the present invention utilizes additional converters (in this case either DACs or ADCs depending on whether D/A or A/D conversion is taking place) in the production of a composite signal with the dither component substantially eliminated. As shown, apparatus 300 comprises signal sources 351–355, dither generator 303, multiple summing circuits 307–311, multiple converters 321–325, and summing circuitry 341. Although apparatus 300 is shown comprising multiple signals emanating from multiple signal sources 351–355, apparatus 300 may comprise multiple signals emanating from a single signal source without varying from the scope of the invention. Operation of apparatus 300 in accordance with the alternate embodiment of the present invention occurs as follows: Signal sources 351–355, which may be either analog or digital signal sources generates signals 359–363 that are output to N summing circuits 307–311, where N is an integer value. Additionally, dither generator 303 generates N dither signals that are output to N summing circuits 307–311. In the alternate embodiment, the N dither signals are cyclical in nature but differ from each other by the fact that each signal is offset in phase by 360/N degrees from the other signals. For example, where N=3, each of the three dither signals would be offset by 360/3 degrees from each other.

Continuing, N summing circuits 307–311 add the appropriate dither signal to signals 359–363 to form N signals with dither components 312–314. Signals 312–314 enter respective converters 321–325 and are subsequently converted to a second group of N signal equivalents 327–331. In particular, signals 312–314 enter converters 321–325 and are converted either to N analog or N digital signal equivalents containing dither, depending on whether converters 321–325 are DACs or ADCs respectively. Like the preferred embodiment, in the alternate embodiment the converters 321–325 are identical converters utilizing similar circuitry in order reduce board space and to keep each response similar.

Continuing, digital or analog signal equivalents 327–331 output from converters 321–325 enter summing circuitry 341 where the N signal equivalents 327–331 are summed to produce a composite analog or digital output signal with all noise caused by the N dither signals substantially removed. Because converters 321–325 utilize similar circuitry (i.e., produce similar responses to input signals), the addition of signals 327–331 will result in the addition of N signals each having a dither component that is substantially 360/N degrees offset from each other, resulting in a signal with the dither component substantially eliminated. Stated differently, a sum of signals 359–363 that are output to N summing circuits 307–311 will substantially equal a sum of N signals with dither components 312–314 since the dither components are 360/N degrees offset from each other and will cancel.

Figure 4:
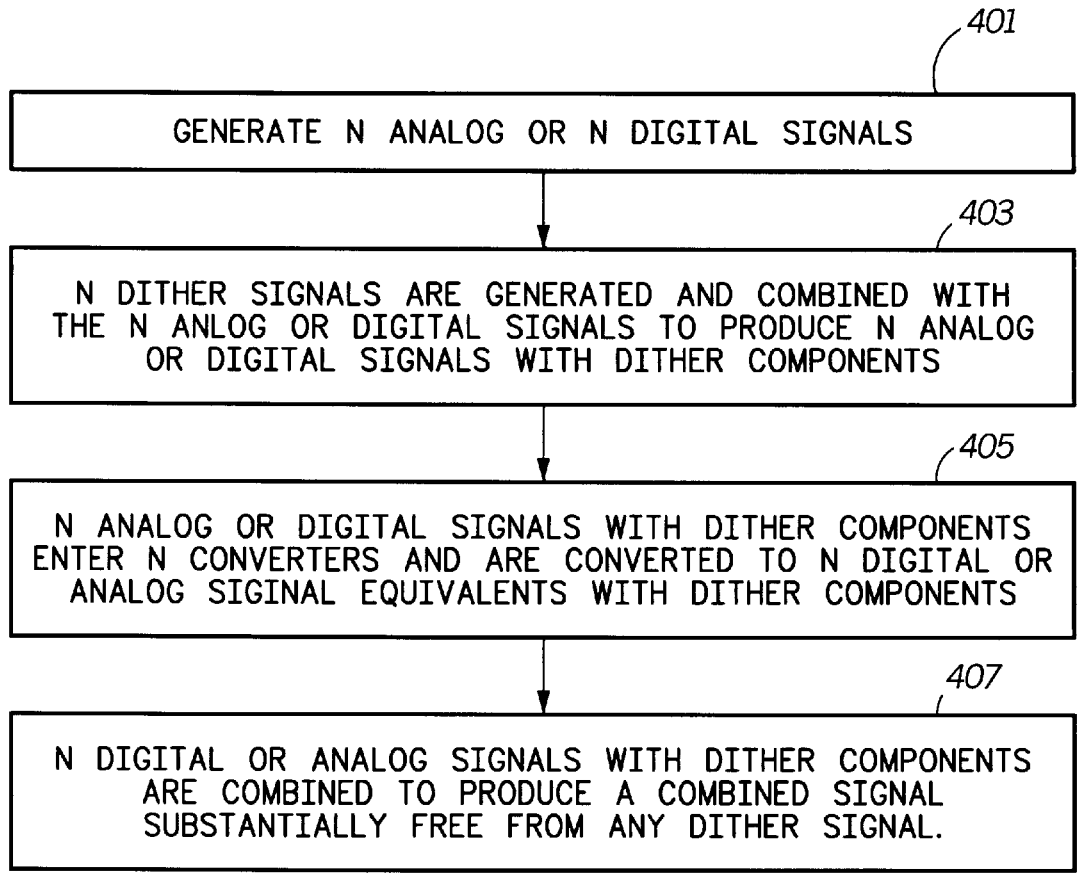
FIG. 4 is a flow chart illustrating operation of the apparatus for the addition and removal of a dither signal in accordance with the alternate embodiment of the present invention.

FIG. 4 is a flow chart illustrating operation of apparatus 300 in accordance with the alternate embodiment of the present invention. The logic flow starts at step 401 where N signals are generated. In particular, this is accomplished by signal sources 351–355 generating either digital or analog signals 359–363 (depending on whether D/A or A/D conversion is taking place) that are output to N summing circuits 307–311. Next, at step 403 N dither signals are generated and combined with the N signals to produce N signals with dither components. In particular, dither generator 303 generates N dither signals that are output to N summing circuits 307–311 where they are added to signals 359–363. As discussed above, in the alternate embodiment, the N dither signals are cyclical in nature, and are each offset in phase from each other by 360/N degrees.

Continuing, at step 405, the N signals with dither components enter N converters and are subsequently converted to N analog or N digital signal equivalents depending on whether converters 321–325 are D/A or A/D converters respectively. This is accomplished in the preferred embodiment of the present invention by inputting signals 312–314 into respective converters 321–325. As mentioned above, in the alternate embodiment, converters 321–325 are identical converters utilizing similar circuitry in order to reduce board space and to keep each response similar.

Finally, at step 407, the N analog or digital signals with dither components are combined to produce a combined analog or a combined digital signal substantially free from any dither signal. In particular, N analog or digital signals 327–331 output from N converters 321–325 respectively enter summing circuitry 341 where N signals 327–331 are summed to produce an output signal with all dither signals substantially removed. Because the phases of the N dither signals are such that the addition of signals 359–363 (signals without dither added) will substantially equal the addition of signals 312–314 (signals with dither added), the addition of signals 327–331 (after A/D or D/A conversion) will result in a combined signal substantially free from any dither component.

The descriptions of the invention, the specific details, and the drawings mentioned above, are not meant to limit the scope of the present invention. For example, although the embodiments described above utilized summing circuitry to combine signal sources with dither components via an additive operation, the combination of signal sources with dither components may take place via other operations (i.e., multiplication) such that the combination of the signals with dither components creates a cancellation of the dither components. It is the intent of the inventor that various modifications can be made to the present invention without varying from the spirit and scope of the invention, and it is intended that all such modifications come within the scope of the following claims.

What is claimed is:

1. A method for adding and removing dither from a first and a second digital signal, the method comprising the steps of:
    generating a first digital signal and a second digital signal;
    generating a first dither signal and a second dither signal;
    combining the first dither signal at a first phase with the first digital signal to produce a first digital signal with dither;
    combining the second dither signal at a second phase with the second digital signal to produce a second digital signal with dither, wherein the second phase is substantially 180 degrees offset from the first phase;
    converting the first digital signal with dither to a first analog signal with dither;
    converting the second digital signal with dither to a second analog signal with dither; and
    combining the first and the second analog signals to produce a third analog signal having the dither substantially removed.

2. The method of claim 1 wherein the steps of combining dither comprises the steps of adding dither via an addition operation.

3. The method of claim 1 wherein the step of combining the first and the second analog signals comprises the step of adding the first and the second analog signals.

4. A method for adding and removing a dither signal from a plurality of signals, wherein a sum of the plurality of signals equals a first value, the method comprising the steps of:
    generating a plurality of signals;
    generating a plurality of dither signals;
    combining the plurality of dither signals at a plurality of phases with the plurality of signals to produce a plurality of signals with dither, wherein a sum of the plurality of signals with dither is substantially equal to the first value;
    converting the plurality of signals with dither to a second plurality of signals with dither; and
    combining the second plurality of signals with dither to form a combined signal having the plurality of dither signals substantially eliminated.

5. The method of claim 4 wherein the step of combining the plurality of dither signals with the plurality of signals comprises the step of combining a plurality of digital dither signals with a plurality of digital signals.

6. The method of claim 4 wherein the step of combining the plurality of dither signals with the plurality of signals comprises the step of combining a plurality of analog dither signals with a plurality of analog signals.

7. The method of claim 4 wherein the step of converting the plurality of signals with dither to a second plurality of signals with dither comprises the step of converting a plurality of digital signals with dither to a plurality of analog signals with dither.

8. The method of claim 4 wherein the step of converting the plurality of signals with dither to a second plurality of signals with dither comprises the step of converting a plurality of analog signals with dither to a plurality of digital signals with dither.

9. The method of claim 4 wherein the step of combining the second plurality of signals with dither to form a combined signal comprises the step of adding the second plurality of signals via an addition operation.

10. The method of claim 4 wherein the step of combining the second plurality of signals with dither to form a combined signal comprises the step of adding the second plurality of signals via a multiplication operation.

11. An apparatus for adding and removing a dither signal from a plurality of signals, wherein a sum of the plurality of signals equals a first value, the apparatus comprising:

a plurality of signal sources generating a plurality of signals;

a dither generator outputting a plurality of dither signals;

first combining circuitry having the plurality of signals and the plurality of dither signals as an input and outputting a plurality of signals with dither, wherein a sum of the plurality of signals with dither is substantially equal to the first value;

a plurality of converters having the plurality of signals with dither as inputs and outputting a plurality of converted signals with dither; and a second combining circuit having the plurality of converted signals with dither as an input and outputting a combined signal having the plurality of dither signals substantially eliminated.

12. The apparatus of claim 11 wherein the plurality of signal sources comprise a plurality of digital signal sources.

13. The apparatus of claim 12 wherein the plurality of converters comprise a plurality of digital to analog converters.

14. The apparatus of claim 11 wherein the plurality of signal sources comprise a plurality of analog signal sources.

15. The apparatus of claim 14 wherein the plurality of converters comprise a plurality of analog to digital converters.

16. The apparatus of claim 11 wherein the combining circuitry utilizes an additive operation when combining signals.

* * * * *